United States Patent
Lee et al.

(10) Patent No.: US 9,406,785 B2
(45) Date of Patent: Aug. 2, 2016

(54) THIN FILM TRANSISTOR AND METHOD OF FORMING THE SAME

(71) Applicant: SAMSUNG DISPLAY CO., LTD., Yongin, Gyeonggi-Do (KR)

(72) Inventors: Doo Hyoung Lee, Suwon-si (KR); Bo Sung Kim, Seoul (KR); Chan Woo Yang, Siheung-si (KR); Seung-Ho Jung, Yongin-si (KR); Yeon Taek Jeong, Seoul (KR); June Whan Choi, Seoul (KR); Tae-Young Choi, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/521,043

(22) Filed: Oct. 22, 2014

(65) Prior Publication Data

US 2015/0044817 A1 Feb. 12, 2015

Related U.S. Application Data

(62) Division of application No. 13/673,195, filed on Nov. 9, 2012, now Pat. No. 8,895,977.

(30) Foreign Application Priority Data

May 30, 2012 (KR) ........................ 10-2012-0057459

(51) Int. Cl.
*H01L 21/441* (2006.01)
*H01L 21/02* (2006.01)
*H01L 21/385* (2006.01)
*H01L 29/66* (2006.01)
*H01L 29/786* (2006.01)
*H01L 21/477* (2006.01)

(52) U.S. Cl.
CPC .... *H01L 29/66969* (2013.01); *H01L 21/02565* (2013.01); *H01L 21/02614* (2013.01); *H01L 21/385* (2013.01); *H01L 21/441* (2013.01); *H01L 21/477* (2013.01); *H01L 29/7869* (2013.01)

(58) Field of Classification Search
None
See application file for complete search history.

(56) References Cited

U.S. PATENT DOCUMENTS 5,712,187 A * 1/1998 Li et al. ......................... 438/488
2012/0193620 A1 8/2012 Godo et al.

(Continued)

FOREIGN PATENT DOCUMENTS

JP 2009-277710 11/2009
KR 1020100070652 6/2010

*Primary Examiner* — Charles Garber
*Assistant Examiner* — Stanetta Isaac
(74) *Attorney, Agent, or Firm* — F. Chau & Associates, LLC

(57) ABSTRACT

A thin film transistor includes a substrate, an oxide semiconductor layer that is disposed on the substrate, a gate electrode that overlaps with the oxide semiconductor layer, a gate insulating layer that is disposed between the oxide semiconductor layer and the gate electrode, and a source electrode and a drain electrode that at least partially overlap with the oxide semiconductor layer and are spaced from each other. The gate insulating layer includes an oxide including a first material. The oxide semiconductor layer includes an oxide which includes a same material as the first material and a second material, and the source electrode and the drain electrode include an oxide that includes a same material as the second material and a third material, and a grain boundary is not formed on an interface between at least one of the gate insulating layer and the oxide semiconductor layer or between the oxide semiconductor layer, and the source electrode and the drain electrode.

21 Claims, 10 Drawing Sheets

(56) References Cited

U.S. PATENT DOCUMENTS

| | | |
|---|---|---|
| 2012/0252160 A1 | 10/2012 | Yamazaki |
| 2012/0280362 A1* | 11/2012 | Yang et al. .................... 257/613 |
| 2012/0286262 A1 | 11/2012 | Koyama et al. |
| 2013/0200386 A1* | 8/2013 | Hutchings et al. .............. 257/75 |

* cited by examiner

THIN FILM TRANSISTOR AND METHOD OF FORMING THE SAME

CROSS-REFERENCE TO RELATED APPLICATION

This application is a divisional application of U.S. patent application Ser. No. 13/673,195, filed on Nov. 9, 2012, which claims priority to Korean Patent Application No. 10-2012-0057459 filed on May 30, 2012, the entire disclosures of which are hereby incorporated by reference herein in their entirety.

TECHNICAL FIELD

The present disclosure relates to a thin film transistor and a method of forming the same.

DISCUSSION OF THE RELATED ART

Flat panel displays, such as, for example, liquid crystal displays (LCDs), organic light emitting diode displays (OLEDs), electrophoretic displays and plasma displays may include two or more pairs of field generating electrodes and electro-optical active layers, which are placed between the field generating electrodes. The LCD includes a liquid crystal layer as an electro-optical active layer, and the OLED includes an organic light emitting layer as an electro-optical active layer. One of a pair of field generating electrodes may be connected to a switching element to receive electrical signals, and the electro-optical active layer may convert such electrical signals into optical signals to display images.

For example, the flat panel display may include a thin film transistor for switching each pixel. The thin film transistor constitutes a switching element with, for example, three terminals that are a gate electrode for receiving switching signals, a source electrode for receiving voltages, and a drain electrode for outputting data electrodes. Further, such a thin film transistor includes, for example, an active channel layer, which is overlapped with a gate electrode, a source electrode and a drain electrode. For example, silicon as a semiconductor material may be used for the active channel layer.

However, as the size of displays becomes larger, a thin film transistor that can be driven at super-high speed may need to be developed. For example, amorphous silicon used for forming the active channel layer has low electron mobility and may need relatively expensive vacuum process-based deposition equipment for applying a chemical vapor deposition (CVD) process and a sputtering technique to have it manufactured.

Accordingly, there is a need in the art to develop oxide semiconductor materials that provide high electron mobility and enable a solution process to be performed through a coating process or a relatively inexpensive printing process.

However, if the active channel layer is formed through the solution process, an interface property with a neighboring layer may get worse, and thus the properties of the thin film transistor can be deteriorated.

SUMMARY OF THE INVENTION

Exemplary embodiments of the present invention provide a thin film transistor and a method of forming the same that increase interface properties of the thin film transistor and simplify processes in forming the thin film transistor.

An exemplary embodiment of the present invention provides a thin film transistor, including: a substrate, an oxide semiconductor layer disposed on the substrate, a gate electrode overlapping with the oxide semiconductor layer, an gate insulating layer disposed between the oxide semiconductor layer and the gate electrode, and a source electrode and a drain electrode that at least partially overlap with the oxide semiconductor layer and are spaced each other. The gate insulating layer includes an oxide including a first material, the oxide semiconductor layer includes an oxide which includes a same material as the first material and a second material, and the source and drain electrodes include an oxide which includes a same material as the second material and a third material and a grain boundary is not formed on an interface between at least one of the gate insulating layer and the oxide semiconductor layer or between the oxide semiconductor layer, and the source electrode and the drain electrode.

The first material may be a precursor that includes at least one of silicon (Si), hafnium (Hf), aluminum (Al), titanium (Ti), zirconium (Zr), yttrium (Y) and tantalum (Ta), the second material may be a precursor that includes at least one of indium (In), tin (Sn), zinc (Zn), silver (Ag), Copper (Cu), cadmium (Cd) and gold (Au), and the third material may be a precursor that includes at least one of tin (Sn), zinc (Zn), silver (Ag), Copper (Cu), cadmium (Cd) and gold (Au).

A grain boundary may not be formed on an interface between the gate insulating layer and the oxide semiconductor layer.

A grain boundary may not be formed on an interface between the oxide semiconductor layer and the source electrode, and between the oxide semiconductor layer and the drain electrode.

The oxide semiconductor layer may include silicon-indium oxide.

The oxide semiconductor layer may include hafnium-indium oxide.

A channel region may be disposed on a portion of the oxide semiconductor layer between the source electrode and the drain electrode.

The source electrode and the drain electrode may extend into the oxide semiconductor layer and the source electrode and the drain electrode may be formed of the same layer as the channel portion.

According to an exemplary embodiment of the present invention a method of forming a thin film transistor is provided. The method includes forming a first coating layer by coating a first precursor on a substrate, forming a second coating layer by coating a second precursor on the first coating layer, forming a third coating layer by coating a third precursor on the second coating layer, and heating the first coating layer, the second coating layer, and the third coating layer simultaneously. The forming of the first coating layer, the second coating layer, and the third coating layer includes performing a solution process.

By heating the first coating layer, the second coating layer and the third coating layer, an insulating layer including an oxide including the first precursor may be formed, the first precursor may be combined with the second precursor to form an oxide semiconductor layer, and the second precursor may be combined with the third precursor to form a source/drain layer.

The first precursor may include at least one of silicon (Si), hafnium (Hf), aluminum (Al), titanium (Ti), zirconium (Zr), yttrium (Y) and tantalum (Ta), the second precursor may include at least one of indium (In), tin (Sn), zinc (Zn), silver (Ag), Copper (Cu), cadmium (Cd) and gold (Au), and the third precursor may include at least one of tin (Sn), zinc (Zn), silver (Ag), Copper (Cu), cadmium (Cd) and gold (Au).

By heating the first coating layer, the second coating layer and the third coating layer, the first precursor may diffuse to the second coating layer and be combined with the second precursor to form the oxide semiconductor layer and the second precursor may diffuse to the third coating layer or the third precursor may diffuse to the second coating layer to form a source/drain layer.

A grain boundary may not be formed on an interface between the insulating layer and the oxide semiconductor layer.

A grain boundary may not be formed on an interface between the oxide semiconductor layer, and the source and drain layer.

The oxide semiconductor layer may be formed to include silicon-indium oxide.

The oxide semiconductor layer may be formed to include hafnium-indium oxide.

Before heating the first coating layer, the second coating layer and the third coating layer, the method may further include patterning the third coating layer to form a source forming region and a drain forming region separated from each other on the second coating layer.

The patterning of the third coating layer may include one of a photolithography technique or a lift off technique.

After the heating of the first coating layer, the second coating layer and the third coating layer, the third precursor may diffuse to the second coating layer and be combined with the second precursor to form a source electrode and a drain electrode which are separated from each other and the source electrode and the drain electrode may define a region which extends into the second coating layer.

In accordance with an exemplary embodiment of the present invention, a method of forming a thin film transistor is provided. The method includes, for example, forming a first coating layer by coating a first mixture including an insulating layer precursor mixed with a first solvent on a substrate, forming a second coating layer by coating a second mixture including a semiconductor-layer precursor mixed with a second solvent on the first coating layer, forming a third coating layer by coating a third mixture including a source/drain precursor mixed with a third solvent on the second coating layer, and forming a source forming region and a drain forming region on the second coating layer.

The method further includes heating the first coating layer, the second coating layer, the source forming region and the drain forming region such that insulating layer precursor is oxidized to form an insulating layer comprising an oxide including the insulating layer precursor on the substrate, the insulating layer precursor diffuses to the second coating layer and is combined with the semiconductor layer precursor to form an oxide semiconductor layer on the insulating layer, and the semiconductor layer precursor diffuses to the third coating layer and the source/drain precursor diffuses to the second coating layer such that the semiconductor layer precursor is combined with the source/drain precursor to form a source electrode and a drain electrode on the oxide semiconductor layer.

According to exemplary embodiments of the present invention, as insulating layer-semiconductor-source/drain precursors are subjected to a solution process and then are treated by heating once to form an insulating layer, a semiconductor layer, and source/drain electrodes through inter-layer material diffusion, processes can be simplified and inter-layer interface properties can be increased.

DETAILED DESCRIPTION OF EXEMPLARY EMBODIMENTS

Figure 1:
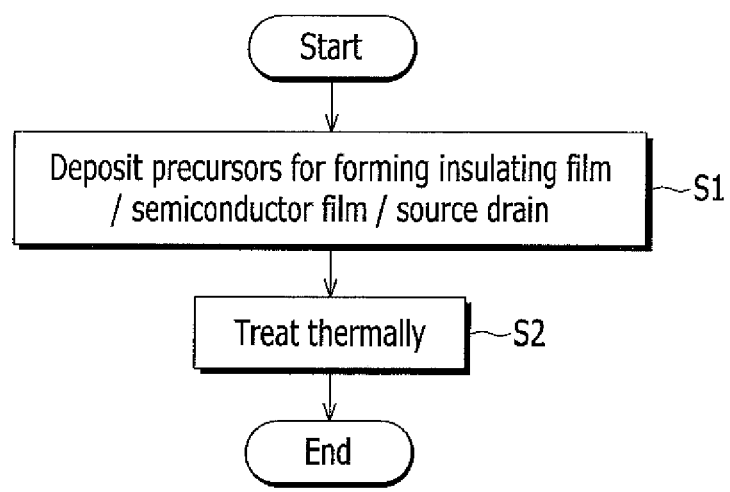
FIG. 1 is a flow chart illustrating a method of forming a thin film transistor according to an exemplary embodiment of the present invention.

Exemplary embodiments of the present invention will be described in detail with reference to the accompanying drawings.

In the drawings, the thickness of layers and regions may be exaggerated for clarity. Further, when a layer is referred to as being "on" another layer or a substrate, it can be directly on the other layer or the substrate or an intervening layer or layers may also be present. Like reference numerals designate like elements throughout the specification. As used herein, the singular forms "a," "an" and "the" are intended to include the plural forms as well, unless the context clearly indicates otherwise.

FIG. 1 is a flow chart illustrating a method of forming a thin film transistor according to an exemplary embodiment of the present invention.

For example, referring to FIG. 1, a precursor for forming an insulating layer (hereinafter referred to as "an insulating-layer precursor") is deposited on a substrate, a precursor for forming a semiconductor layer (hereinafter, referred to as "a semiconductor-layer precursor") is deposited on the deposited insulating-layer precursor, and a precursor for forming source/drain (hereinafter referred to as "a source/drain precursor") is deposited on the deposited semiconductor-layer precursor in the present exemplary embodiment (S1).

For example, an insulating-layer precursor is mixed with a solvent to form a first mixture and the first mixture is coated on the substrate through a solution process. Likewise, a semiconductor-layer precursor is mixed with a solvent to form a second mixture and the second mixture is coated on the first mixture including the insulating-layer precursor and the solvent, which has been coated through the solution process. Then, a source/drain precursor is mixed with a solvent to form a third mixture and the third mixture is coated on the second mixture including the semiconductor-layer precursor and the solvent, which has been coated through the solution process.

Here, the coating can be, for example, one of spin coating, dip coating, bar coating, screen printing, slide coating, roll coating, spray coating, slot coating, dip-pen, inkjet, and nano dispensing-coating techniques.

The solvent may include, for example, at least one selected from a group consisting of water, ether and alcohol. For example, in an exemplary embodiment, the solvent may include at least one compound selected from methanol, ethanol, propanol, isopropanol, 2-methoxyethanol, 2-ethoxyethanol, 2-propoxyethanol, 2-buthoxyethanol, butadiol, methylcellosolve, ethylcellosolve, ethyleneglycol, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propyleneglycolpropylether, methylcellosolveacetate, ethylcellosolveacetate, diethyleneglycolmethylacetate, diethyleneglycolethylacetate, acetone, methylisobutylketone, cyclohexanone, dimethyl formamide (DMF), N,N-dimethyl acetamide (DMAc), N-methyl-2-pyrolidone, γ-butyrolactone, diethylether, ethyleneglycoldimethylether, diglyme, tetrahydrofuran, acetylacetone, and acetonitrile.

The insulating-layer precursor in the present exemplary embodiment includes, for example, at least one of silicon (Si), hafnium (HO), aluminum (Al), titanium (Ti), zirconium (Zr), yttrium (Y) and tantalum (Ta). In addition, in an exemplary embodiment, the insulating-layer precursor may be formed of other materials such as, for example, at least one of scandium (Sc), lanthanum (La), cerium (Ce), praseodymium (Pr), neodymium (Nd), samarium (Sm), Europium (Eu), gadolinium (Gd), terbium (Tb), dysprosium (Dy), holmium (Ho), erbium (Er), ytterbium (Yb), lutetium (Lu), strontium (Sr), niobium (Nb), tungsten (W) and bismuth (Bi).

In the present exemplary embodiment, the semiconductor-layer precursor includes at least one of, for example, indium (In), tin (Sn), zinc (Zn), silver (Ag), Copper (Cu), cadmium (Cd) and gold (Au). In addition, for example, in an exemplary embodiment, the semiconductor-layer precursor may be formed of other materials such as, for example, at least one of lithium (Li) and potassium (K), magnesium (Mg), calcium (Ca), strontium (Sr), gallium (Ga), germanium (Ge), tantalum (Ta), vanadium (V), niobium (Nb), antimony (Sb), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The source/drain precursor in the present exemplary embodiment includes, for example, at least one of tin (Sn), zinc (Zn), silver (Ag), Copper (Cu), cadmium (Cd), and gold (Au). Additionally, in an exemplary embodiment, the source/drain precursor may be formed of other materials such as, for example, at least one of molybdenum (Mo), chromium (Cr), tantalum (Ta), tungsten (W), nickel (Ni), aluminum (Al), cobalt (Co), ruthenium (Ru), platinum (Pt).

In addition, the above-mentioned first mixture, second mixture and third mixture may each further include, for example, a stabilizer. The stabilizer may include, for example, at least one compound selected from an alcohol amine compound, an alkyl ammonium hydroxy compound, an alkyl amine compound, a ketone compound, an acid compound, a base compound, and deionized water. For example, in an embodiment, the stabilizer may include at least one of diketone, amino alcohol, and polyamine. For example, the diketone may include acetylacetone. In addition, the amino alcohol may include, for example, at least one selected from the group including ethanolamine, diethanolamine, and triethanolamine.

Then, the first mixture, the second mixture and the third mixture coated on the substrate are treated by, for example, heating them simultaneously (S2).

If the three mixtures are treated by heating them simultaneously, the insulating-layer precursor forms an insulating layer including oxide. Further, the insulating-layer precursor diffuses to a region where the semiconductor-layer precursor is located, reacts with the semiconductor-layer precursor, and forms an oxide semiconductor layer. In addition, the semiconductor-layer precursor and the source/drain precursor diffuse and react with each other to form a source/drain layer that is formed by combining the semiconductor-layer precursor and the source/drain precursor with each other.

For example, if the insulating-layer precursor includes silicon (Si), the semiconductor-layer precursor includes indium (In), and the source/drain precursor includes tin (Sn), a silicon oxide insulating layer, an oxide semiconductor layer including silicon-indium oxide and source/drain including indium-tin oxide are formed through heat treatment. The above is only an example, and thus various combinations of materials can be formed by combining the precursors mentioned above. Further, materials not mentioned above may be used to form the insulating layer, the oxide semiconductor layer, and the source/drain.

By forming a thin film transistor according to exemplary embodiments of the present invention, the formation of a grain boundary on an interface between layers in the thin film transistor may not occur or may be decreased in comparison to previous methods of forming only one layer using a solution process, thereby increasing interface properties of the thin film transistor and simplifying the process in forming the thin film transistor.

FIGS. 2 to 10 explain the process described in connection with FIG. 1 in more detail.

Figure 2:
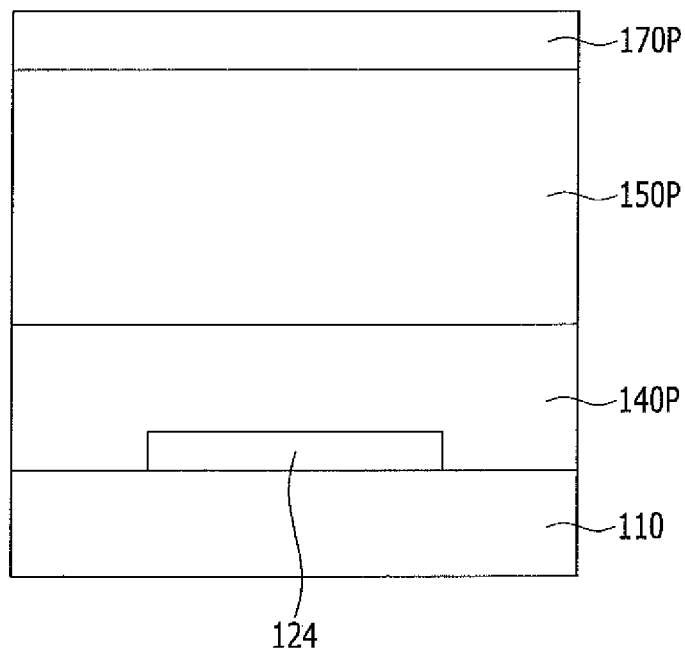
FIGS. 2 to 4 are cross sectional views illustrating a method of forming a thin film transistor according to an exemplary embodiment of the present invention.
Figure 3:
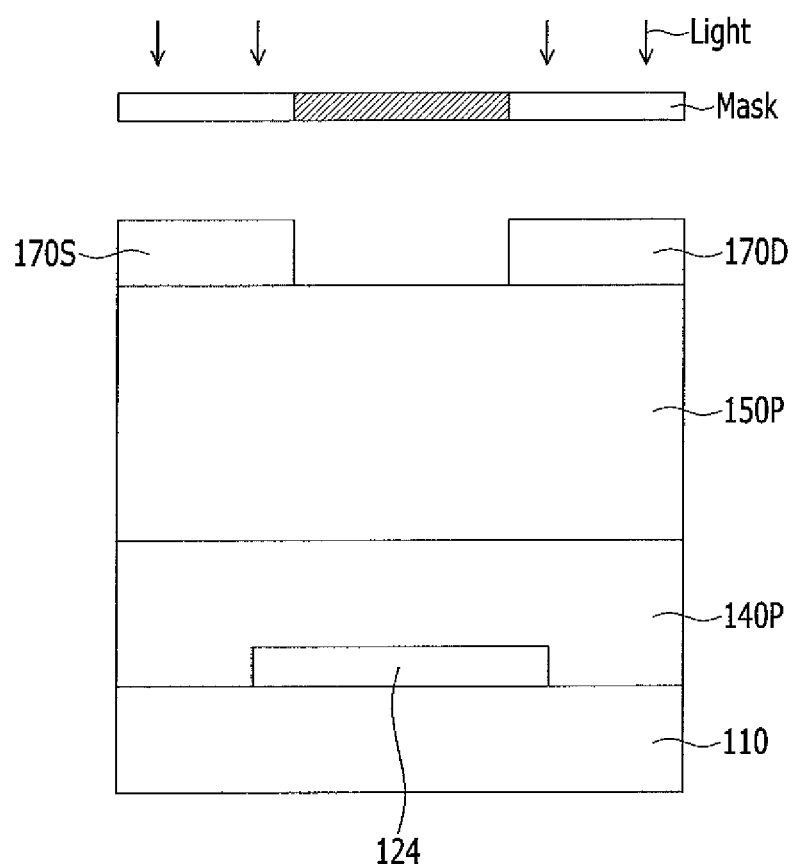
Figure 4:
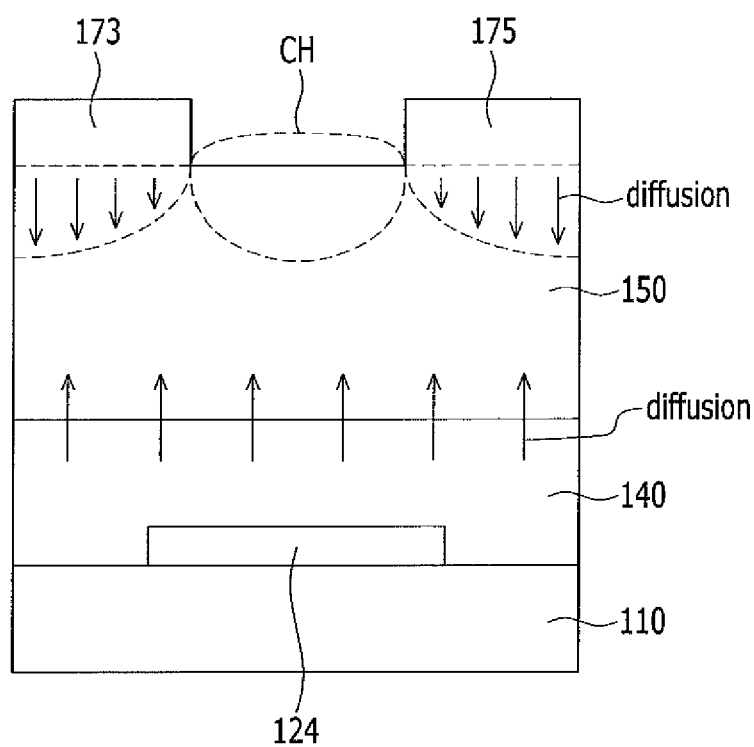

FIGS. 2 to 4 are cross sectional views illustrating a method of forming a thin film transistor according to an exemplary embodiment of the present.

Referring to FIG. 2, a gate electrode 124 is formed on a substrate 110. The substrate 110 may be formed of, for example, a glass substrate, a quartz substrate, or a plastic substrate. The plastic substrate may include, for example, one of polycarbonate (PC), polyester (PET), polypropylene (PP), polyethylene (PE) and polymethyl methacrylate (PMMA). Alternatively, in an exemplary embodiment, the substrate 110 may instead be formed of a non-transparent material such as, for example, a silicon plate or ceramics.

The gate electrode 124 may include, for example, an Al-based metal such as aluminum (Al) and an Al alloy, silver (Ag)-based metal, such as Ag and an Ag alloy, copper (Cu)-based metal such as Cu and a Cu alloy, molybdenum (Mo)-based metal such as Mo and a Mo alloy, chromium (Cr), titanium (Ti), and tantalum (Ta). In addition, the gate electrode 124, may be formed of other materials such as, for example, nickel (Ni), tungsten (W), gold (Au), palladium (Pd), platinum (Pt), neodymium (Nd), zinc (Zn), cobalt (Co) and any mixtures or alloys thereof. Moreover, the gate electrode 124 may include, for example, a transparent conductive material such as an indium tin oxide (ITO), an indium zinc oxide (IZO) and an aluminum doped zinc oxide (AZO).

Further, the gate electrode 124 may have, for example, a multilayered structure that includes two conductive layers (not shown) with different physical properties. For example, one of the conductive layers is a first conductive layer made of metal with low resistivity, such as Al-based metal, Ag-based metal, Cu-based metal, which is able to reduce a delay in signals or a drop in voltages. The other conductive layer is a second conductive layer made of a different material than the first conductive layer such as for example, a material with excellent contact property with zinc oxide. The second conductive layer may include, for example, a Mo-based metal, chromium (Cr), titanium (Ti), tantalum (Ta). For example, in an exemplary embodiment, the gate electrode 124 may include a Cr lower layer and an Al upper layer, an Al lower layer and a Mo upper layer, or a Ti lower layer and a Cu upper layer.

However, exemplary embodiments of the present invention are not limited thereto and the gate electrode 124 may be made of various metal and conductors.

A first mixture including an insulating-layer precursor and a solvent, a second mixture including a semiconductor-layer precursor and a solvent, and a third mixture including source/drain precursor and a solvent are sequentially coated on the gate electrode 124 using a solution process to form a first coating layer 140P, a second coating layer 150P and a third coating layer 170P, respectively.

The solution process may include, for example, one of spin coating, dip coating, bar coating, screen printing, slide coating, roll coating, spray coating, slot coating, dip-pen, ink jet, and nano dispensing techniques.

As described in FIG. 1, the insulating-layer precursor may include, for example, at least one of silicon (Si), hafnium (Hf), aluminum (Al), titanium (Ti), zirconium (Zr), yttrium (Y) and tantalum (Ta). The semiconductor-layer precursor may include, for example, at least one of indium (In), tin (Sn), zinc (Zn), silver (Ag), Copper (Cu), cadmium (Cd) and gold (Au) and the source/drain precursor may include, for example, at least one of tin (Sn), zinc (Zn), silver (Ag), Copper (Cu), cadmium (Cd) and gold (Au).

Further, as mentioned above, the insulating-layer precursor may also be formed of other materials such, for example, at least one of scandium (Sc), lanthanum (La), cerium (Ce), praseodymium (Pr), neodymium (Nd), samarium (Sm), Europium (Eu), gadolinium (Gd), terbium (Tb), dysprosium (Dy), holmium (Ho), erbium (Er), ytterbium (Yb), lutetium (Lu), strontium (Sr), niobium (Nb), tungsten (W) and bismuth (Bi). In addition, the semiconductor-layer precursor may be formed of other materials such, for example, lithium (Li) and potassium (K), magnesium (Mg), calcium (Ca), strontium (Sr), gallium (Ga), germanium (Ge), tantalum (Ta), vanadium (V), niobium (Nb), antimony (Sb), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Moreover, the source/drain precursor can be formed of other materials such as, for example, at least one of molybdenum (Mo), chromium (Cr), tantalum (Ta), tungsten (W), nickel (Ni), aluminum (Al), cobalt (Co), ruthenium (Ru), platinum (Pt).

In addition, the above-mentioned first mixture, second mixture and third mixture may each further include, for example, a stabilizer. The stabilizer may include, for example, at least one compound selected from an alcohol amine compound, an alkyl ammonium hydroxy compound, an alkyl amine compound, a ketone compound, an acid compound, a base compound, and deionized water. For example, in an embodiment, the stabilizer may include at least one of diketone, amino alcohol, and polyamine. For example, the diketone may include acetylacetone. In addition, the amino alcohol may include, for example, at least one selected from the group including ethanolamine, diethanolamine, and triethanolamine.

Referring to FIG. 3, the third coating layer 170P is patterned using, for example, a photo mask to form a source forming region 170S and a drain forming region 170D.

Referring to FIG. 4, the first coating layer 140P, the second coating layer 150P, the source forming region 170S and the drain forming region 170D are treated by, for example, heating the first coating layer 140P, the second coating layer 150P, the source forming region 170S and the drain forming region 170D, simultaneously. After the heat treatment, the insulating-layer precursor included in the first coating layer 140P is oxidized to form an insulating layer 140 that includes an oxide. For example, the insulating layer 140 formed may include, for example, silicon oxide, hafnium oxide, aluminum oxide, titanium oxide, zirconium oxide, yttrium oxide, tantalum oxide or the like. However, exemplary embodiments of the present invention are not limited to the above-mentioned materials for the insulating layer 140 but rather the insulating layer 140 may be formed of various materials in various combinations.

After the heat treatment, the insulating-layer precursor included in the first coating layer 140P diffuses to the second coating layer 150P that is located over the first coating layer 140P, and reacts with the semiconductor-layer precursor. Then, an oxide semiconductor layer 150 including the insulating-layer precursor and the semiconductor-layer precursor is formed. In an exemplary embodiment, the oxide semiconductor layer 150 may include, for example, silicon-indium oxide, hafnium-Indium oxide, titanium-Indium oxide or the like. However, exemplary embodiments of the present invention are not limited to the above-mentioned materials for the oxide semiconductor layer 150 but rather the oxide semiconductor layer 150 may be formed from various materials in various combinations.

After the heat treatment, the semiconductor-layer precursor included in the second coating layer 150P diffuses to the source forming region 170S and the drain forming region 170D that are located over the second coating layer 150P, and the source/drain precursor included in the source forming region 170S and the drain forming region 170D formed from the third coating layer 170P diffuses to the second coating layer 150P that is located under the source forming region 170S and the drain forming region 170D. Diffused materials react with each other to form a source electrode 173 and a drain electrode 175 that are separated from each other. Then, as the source/drain precursor falls to the second coating layer 150P that underlies and reacts with the semiconductor-layer precursor, the source electrode 173 and the drain electrode 175 may include a lower region that extends into the oxide semiconductor layer 150, as shown in FIG. 4.

A channel region CH may be formed, for example, on a region where a corresponding oxide semiconductor layer 150 is located between the source drain 173 and the drain electrode 175.

For example, by forming a thin film transistor according to exemplary embodiments of the present invention, the formation of a grain boundary on the interface between the insulating layer 140, the oxide semiconductor layer 150 and the source/drain electrodes 173, 175 may be decreased or may not occur, and the thin film transistor may be formed like one layer that is substantially divided into several regions. Thus, as the surface resistance occurring on the interface decreases, the properties of the thin film transistor are increased.

Figure 5:
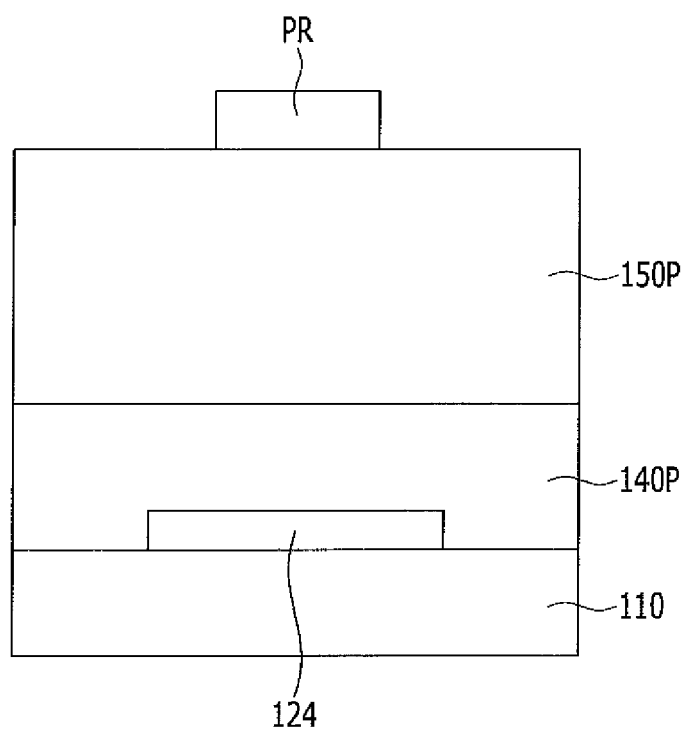
FIGS. 5 to 7 are cross sectional views illustrating a method of forming a thin film transistor according to an exemplary embodiment of the present invention.
Figure 6:
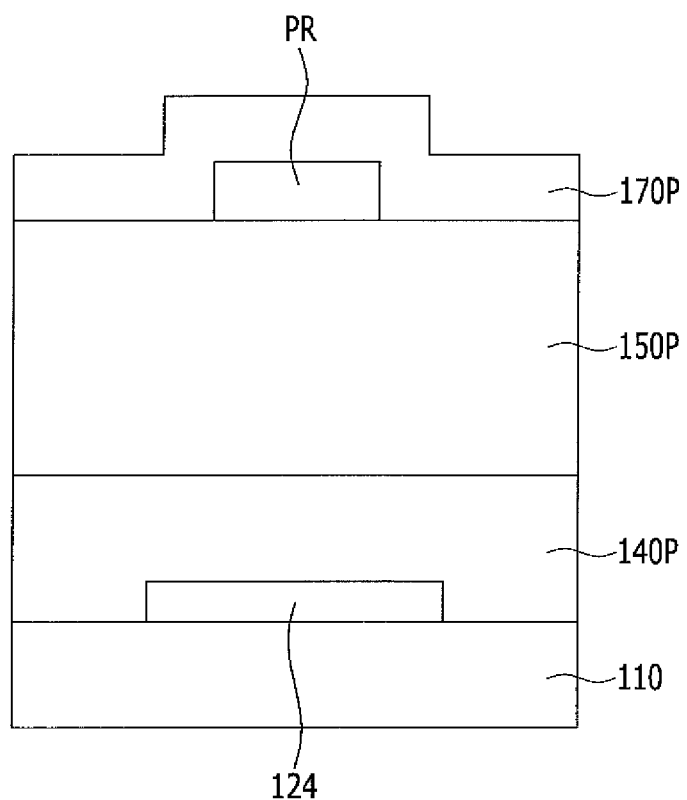
Figure 7:
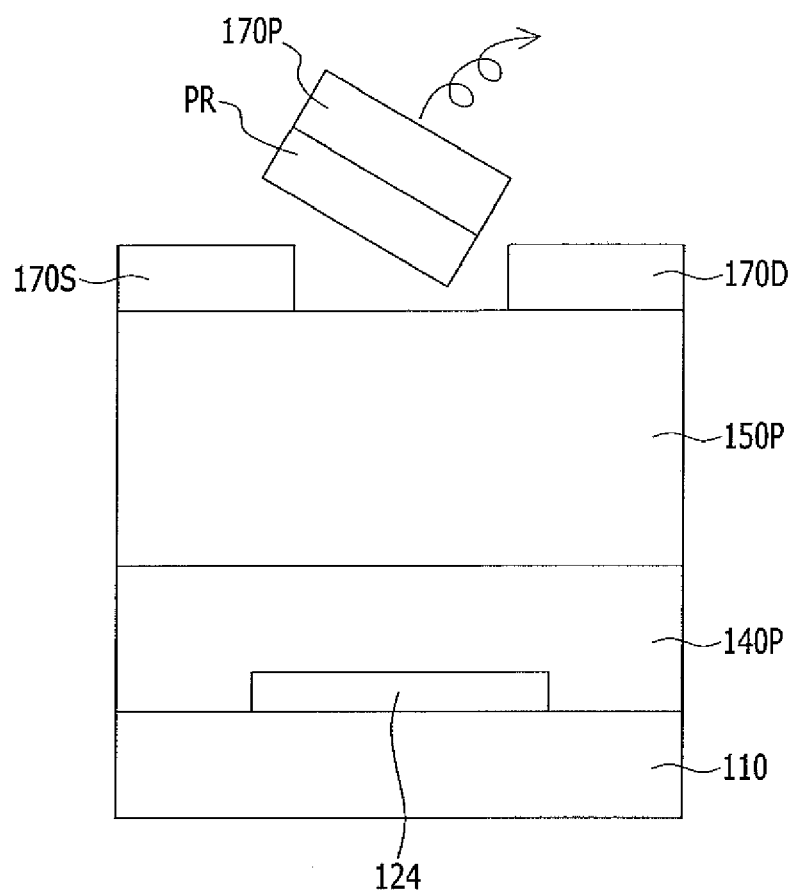

FIGS. 5 to 7 are cross sectional views illustrating a method of forming a thin film transistor according to an exemplary embodiment of the present invention.

The method of the present exemplary embodiment is similar to the method described in connection with FIGS. 2 to 4 and thus only parts in the present exemplary embodiment which are different from those parts described in the method according to FIGS. 2 to 4 are described below.

For example, referring to FIGS. 5 and 6, a gate electrode 124 is formed on a substrate 110, a first mixture including an insulating-layer precursor and a solvent and a second mixture including a semiconductor-layer precursor and a solvent are sequentially coated on the gate electrode 124 using a solution process to form a first coating layer 140P and a second coating layer 150P, respectively.

A photoresist (PR) is patterned on the second coating layer 150P, and then a third mixture including a source/drain precursor and a solvent is coated on the patterned photoresist PR and the second coating layer 150P to form a third coating layer 170P on the patterned photoresist PR and the second coating layer 150P.

Referring to FIG. 7, the patterned photoresist PR and a portion of the third coating layer 170P are lifted off to form a source forming region 170S and a drain forming region 170D, which have an opposite pattern to the patterned photoresist PR.

A heat treatment process may then be performed on the first coating layer 140P, the second coating layer 150P, the source forming region 170S and the drain forming region 170D simultaneously to form the insulating layer 140, the oxide semiconductor layer 150, the source electrode 173, drain electrode 175 and the channel region CH in substantially the same manner as set forth in connection with FIG. 4.

Figure 8:
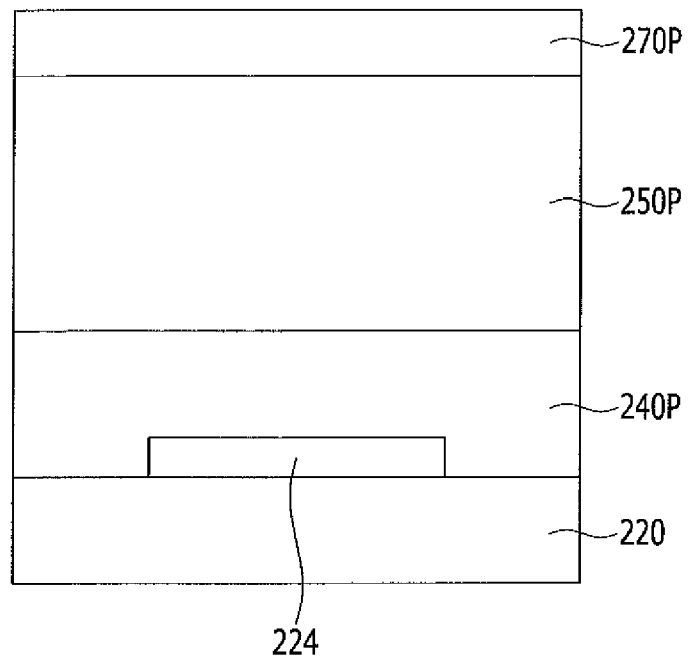
FIGS. 8 to 10 are cross sectional views illustrating a method of forming a thin film transistor according to an exemplary embodiment of the present invention.
Figure 9:
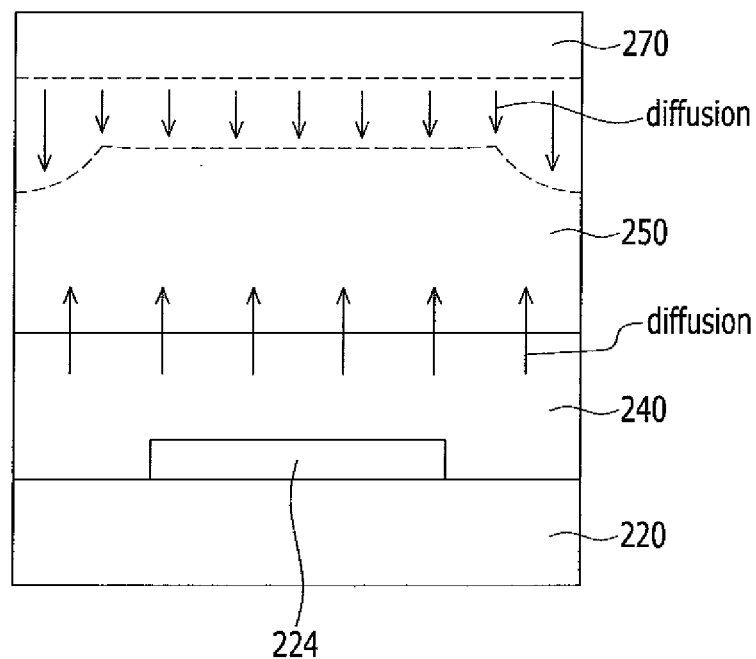
Figure 10:
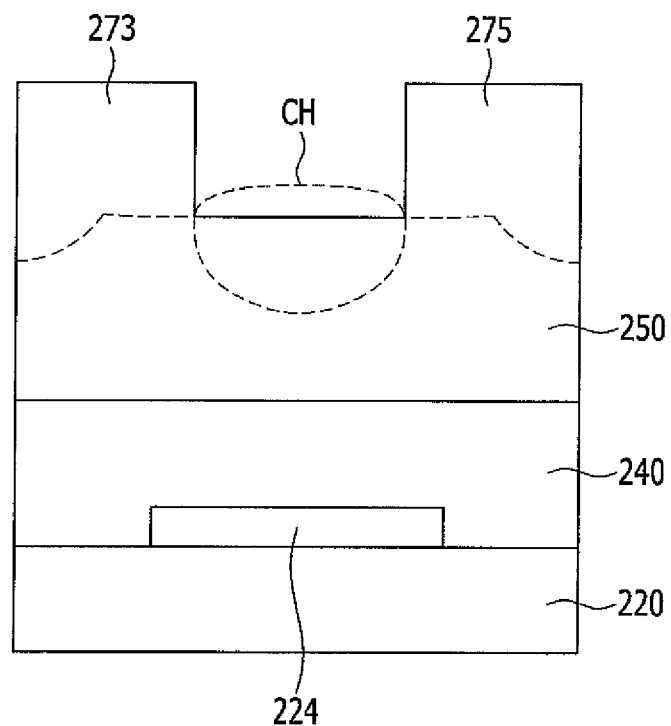

FIGS. 8 to 10 are cross sectional views illustrating a method of forming a thin film transistor according to an exemplary embodiment of the present invention.

The methods of the present exemplary embodiment are similar to the methods described in FIGS. 2 to 4 and thus only parts in the present exemplary embodiments which are different from those parts in the methods described in connection with FIGS. 2 to 4 are described below.

For example, referring to FIG. 8, a gate electrode 224 is formed on a substrate 220 as described in FIGS. 2 to 4. A first mixture including an insulating-layer precursor and a solvent, a second mixture including a semiconductor-layer precursor and a solvent, and a third mixture including a source/drain precursor and a solvent are sequentially coated on the gate electrode 224 using a solution process to form a first coating layer 240P, a second coating layer 250P and a third coating layer 270P, respectively.

For example, referring to FIG. 9, the first coating layer 240P, the second coating layer 250P and the third coating layer 270P which were coated without a patterning process are treated by heating the first coating layer 240P, the second coating layer 250P and the third coating layer 270P simultaneously. After the heat treatment, the insulating-layer precursor included in the first coating layer 240P is oxidized to form the insulating layer 240 including oxide, the insulating-layer precursor included in the first coating layer 240P diffuses to the second coating layer 250P that is located over the first coating layer 240P and reacts with the semiconductor-layer precursor to form an oxide semiconductor layer 250 that includes the insulating-layer precursor and the semiconductor-layer precursor. Further, the semiconductor-layer precursor included in the second coating layer 250P diffuses to the third coating layer 270P that is located over the second coating layer 250P, and the source/drain precursor included in the third coating layer 270P diffuses to the second coating layer 250P that is located under the third coating layer 270P and the semiconductor-layer precursor and the source/drain precursor react with each other to form a source/drain electrode layer 270. Here, the source/drain electrode layer 270 is, for example, one continuous layer.

Referring to FIG. 10, the source/drain electrode layer 270 is patterned using, for example, a photolithography process to form a source electrode 273 and a drain electrode 275 that are separated from each other but exemplary embodiments of the present invention are not limited to a photolithography process for patterning the source/drain electrode layer 270 to form the source electrode 273 and the drain electrode 275.

Thus, a thin film transistor is formed in the present exemplary embodiment which is similar to the thin film transistor formed in FIG. 4.

For example, the thin film transistor formed according to the present exemplary embodiment of the present invention includes a substrate 220, a gate electrode 224 disposed on the substrate 220 and an insulating layer 240 covering the gate electrode 224. The insulating layer 240 may be, for example, an oxide including at least one of silicon (Si), hafnium (Hf), aluminum (Al), titanium (Ti), zirconium (Zr), yttrium (Y) and tantalum (Ta).

An oxide semiconductor layer 250 is located on the gate insulating layer 240. The oxide semiconductor layer 250 may be, for example, an oxide semiconductor that includes at least one of silicon (Si), hafnium (Hf), aluminum (Al), titanium (Ti), zirconium (Zr), yttrium (Y) and tantalum (Ta) and at least one of indium (In), tin (Sn), zinc (Zn), silver (Ag), copper (Cu), cadmium (Cd) and gold (Au).

A source electrode 273 and a drain electrode 275 that are spaced from each other are located on the oxide semiconductor layer 250. The source electrode 273 and the drain electrode 275 may include, for example, conductive materials that include at least one of tin (Sn), zinc (Zn), silver (Ag), copper (Cu), cadmium (Cd) and gold (Au) and at least one of indium (In), tin (Sn), zinc (Zn), silver (Ag), copper (Cu), cadmium (Cd) and gold (Au).

The source electrode 273 and the drain electrode 275 include regions that are extended to, for example, the left and right of the channel region CH of the oxide semiconductor layer 250.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method of forming a thin film transistor, comprising:
   forming a first coating layer by coating a first precursor mixed with a first solvent on a substrate;
   forming a second coating layer by coating a second precursor mixed with a second solvent on the first coating layer;
   forming a third coating layer by coating a third precursor mixed with a third solvent on the second coating layer; and
   heating the first coating layer, the second coating layer and the third coating layer simultaneously,
   wherein the heating occurs after the forming of the first, second, and third coating layers and no additional heating steps are performed prior to the forming of the first, second, and third coating layers.

2. A method of forming a thin film transistor, comprising:
   forming a first coating layer by coating a first precursor on a substrate;
   forming a second coating layer by coating a second precursor on the first coating layer;
   forming a third coating layer by coating a third precursor on the second coating layer; and
   heating the first coating layer, the second coating layer and the third coating layer simultaneously,
   wherein the forming of the first coating layer, the second coating layer and the third coating layer comprises performing a solution process, and
   wherein by the heating of the first coating layer, the second coating layer and the third coating layer, an insulating layer comprising an oxide including the first precursor is formed, the first precursor is combined with the second precursor to form an oxide semiconductor layer, and the second precursor is combined with the third precursor to form a source/drain layer.

3. The method of claim 2, wherein the first precursor comprises at least one material selected from the group consisting of silicon (Si), hafnium (Hf), aluminum (Al), titanium (Ti), zirconium (Zr), yttrium (Y) and tantalum (Ta), wherein the second precursor comprises at least one material selected from the group consisting of indium (In), tin (Sn), zinc (Zn), silver (Ag), copper (Cu), cadmium (Cd) and gold (Au), and wherein the third precursor comprises at least one material selected from the group consisting of tin (Sn), zinc (Zn), silver (Ag), copper (Cu), cadmium (Cd) and gold (Au).

4. The method of claim 3, wherein by the heating of the first coating layer, the second coating layer and the third coating layer, the first precursor diffuses to the second coating layer and is combined with the second precursor to form an oxide semiconductor layer, and the second precursor diffuses to the third coating layer or the third precursor diffuses to the second coating layer to form the source/drain layer.

5. The method of claim 4, further comprising: patterning the source/drain layer to form a source electrode and a drain electrode which are spaced apart from each other on the oxide semiconductor layer.

6. The method of claim 2, wherein a grain boundary is not formed on an interface between the insulating layer and the oxide semiconductor layer.

7. The method of claim 6, wherein a grain boundary is not formed on an interface between the oxide semiconductor layer and the source/drain layer.

8. The method of claim 2, wherein the oxide semiconductor layer includes silicon-indium oxide.

9. The method of claim 2, wherein the oxide semiconductor layer includes hafnium-indium oxide.

10. A method of forming a thin film transistor, comprising:
forming a first coating layer by coating a first precursor on a substrate;
forming a second coating layer by coating a second precursor on the first coating layer;
forming a third coating layer by coating a third precursor on the second coating layer; and
heating the first coating layer, the second coating layer and the third coating layer simultaneously,
wherein the forming of the first coating layer, the second coating layer and the third coating layer comprises performing a solution process, and
wherein before the heating of the first coating layer, the second coating layer and the third coating layer, the method further comprising: patterning the third coating layer to form a source forming region and a drain forming region separated from each other on the second coating layer.

11. The method of claim 10, wherein the pattering of the third coating layer includes one of a photolithography technique or a lift off technique.

12. The method of claim 10, wherein after the heating of the first coating layer, the second coating layer and the third coating layer, the third precursor diffuses to the second coating layer and is combined with the second precursor to form a source electrode and a drain electrode which are separated from each other, and, wherein the source electrode and the drain electrode define a region which extends into the second coating layer.

13. A method of forming a thin film transistor, comprising:
forming a first coating layer by coating a first mixture including an insulating layer precursor mixed with a first solvent on a substrate;
forming a second coating layer by coating a second mixture including a semiconductor-layer precursor mixed with a second solvent on the first coating layer;
forming a third coating layer by coating a third mixture including a source/drain precursor mixed with a third solvent on the second coating layer;
forming a source forming region and a drain forming region on the second coating layer;
heating the first coating layer, the second coating layer, the source forming region and the drain forming region such that insulating layer precursor is oxidized to form an insulating layer comprising an oxide including the insulating layer precursor on the substrate, the insulating layer precursor diffuses to the second coating layer and is combined with the semiconductor layer precursor to form an oxide semiconductor layer on the insulating layer, and the semiconductor layer precursor diffuses to the third coating layer and the source/drain precursor diffuses to the second coating layer such that the semiconductor layer precursor is combined with the source/drain precursor to form a source electrode and a drain electrode on the oxide semiconductor layer.

14. The method of claim 13, wherein the heating of the first coating layer, the second coating layer, the source forming region and the drain forming region is performed simultaneously.

15. The method of claim 14, wherein the first coating layer, the second coating layer and the third coating layer are each formed using a solution process.

16. The method of claim 15, wherein the solution process is a process selected from the group consisting of spin coating, dip coating, bar coating, screen printing, slide coating, roll coating, spray coating, slot coating, dip-pen, ink jet, and nano dispensing techniques.

17. The method of claim 13, wherein at least one of the first solvent, the second solvent or the third solvent comprises one of water, an ether, or an alcohol.

18. The method of claim 13, wherein prior to forming the third coating layer, the method further comprising: forming a patterned photoresist on the second coating layer, forming the third coating layer by coating the third mixture including the source/drain precursor mixed with the third solvent on the patterned photoresist and on the second coating layer, and lifting off the patterned photoresist and a portion of the third coating layer to form the source forming region and the drain forming region on the second coating layer.

19. The method of claim 13, wherein a grain boundary is not formed on an interface between at least one of the insulating layer and the oxide semiconductor layer or between the oxide semiconductor layer, and the source electrode and the drain electrode.

20. The method of claim 19, wherein the insulating layer precursor comprises at least one of the following selected from the group consisting of silicon (Si), hafnium (Hf), aluminum (Al), titanium (Ti), zirconium (Zr), yttrium (Y) and tantalum (Ta), wherein the semiconductor layer precursor comprises at least one of the following selected from the group consisting of indium (In), tin (Sn), zinc (Zn), silver (Ag), copper (Cu), cadmium (Cd) and gold (Au), and wherein the source/drain precursor comprises at least one selected from the group consisting of at least one of tin (Sn), zinc (Zn), silver (Ag), copper (Cu), cadmium (Cd) and gold (Au).

21. The method of claim 20, wherein the insulating layer comprises a silicon oxide, wherein the oxide semiconductor layer comprises silicon-indium oxide and wherein source electrode and the drain electrode each comprise indium-tin oxide.

* * * * *